US011241752B2

(12) United States Patent
Goeke et al.

(10) Patent No.: US 11,241,752 B2
(45) Date of Patent: Feb. 8, 2022

(54) METHOD FOR ELIMINATING RUNOUT OF BRAZE FILLER METAL DURING ACTIVE BRAZING

(71) Applicant: National Technology & Engineering Solutions of Sandia, LLC, Albuquerque, NM (US)

(72) Inventors: Ronald S. Goeke, Los Ranchos, NM (US); Charles A. Walker, Albuquerque, NM (US); Juan A. Romero, Bayfield, CO (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 208 days.

(21) Appl. No.: 16/409,087

(22) Filed: May 10, 2019

(65) Prior Publication Data

US 2020/0023454 A1 Jan. 23, 2020

Related U.S. Application Data (60) Provisional application No. 62/674,860, filed on May 22, 2018.

(51) Int. Cl.
| | | |
|---|---|---|
| *B23K 1/00* | (2006.01) | |
| *B23K 1/20* | (2006.01) | |
| *C23C 16/40* | (2006.01) | |
| *B23K 103/00* | (2006.01) | |

(52) U.S. Cl.
CPC ............. *B23K 1/20* (2013.01); *C23C 16/403* (2013.01); *B23K 2103/52* (2018.08)

(58) Field of Classification Search
CPC .... B23K 1/20; B23K 35/3006; B23K 1/0006; B23K 1/0008; B23K 1/19; B23K 1/206; B23K 2103/00; B23K 2103/10; B23K 2103/18; B23K 2103/52; B23K 35/262; B23K 35/268; B23K 35/3013
See application file for complete search history.

(56) References Cited

U.S. PATENT DOCUMENTS

| | | | |
|---|---|---|---|
| 5,695,861 A  * | 12/1997 | Bloom ................. | B23K 35/262 428/209 |
| 6,315,188 B1 * | 11/2001 | Cadden .................... | B23K 1/20 228/122.1 |
| 2005/0023584 A1* | 2/2005 | Derderian ......... | C23C 16/45536 257/296 |

(Continued)

OTHER PUBLICATIONS

Elam, J.W. et al., "Viscous Flow Reactor with Quartz Crystal Microbalance for Thin Film Growth by Atomic Layer Deposition", Review of Scientific Instruments 73 (2002), pp. 2981-2987.

(Continued)

*Primary Examiner* — Erin B Saad
(74) *Attorney, Agent, or Firm* — Kevin W. Bieg (57) ABSTRACT

Nanometers thick conformal coatings deposited by atomic-layer deposition (ALD) onto the metal surface of an active braze joint modifies the surface chemistry to eliminate excess braze filler metal flow. Unlike other means used to prevent braze filler metal runout, the thin ALD coating does not hinder next assembly processes, does not require post-braze cleaning, and does not alter the base material mechanical properties.

15 Claims, 10 Drawing Sheets

(A)  (B)

(56) References Cited

U.S. PATENT DOCUMENTS

2008/0206928 A1* 8/2008 Onishi .................... B23K 1/20
438/125

OTHER PUBLICATIONS

Vianco, P.T. et al., "Interface Reactions Responsible for Run-Out in Active Brazing: Part 1", Supplement to the Welding Journal, Feb. 2018, vol. 97, pp. 35-s-54-s.

Walker, C. et al., "Preventing Active Braze Filler Metal Run-out Using Conformal ALD Coatings", 7th International Brazing and Soldering Conference 2018, 8 pp.

Walker, C. et al., Power-Point Presentation entitled "Preventing Active Braze Filler Metal Run-out Using Conformal ALD Coatings", 7th International Brazing and Soldering Conference 2018, 23 pp.

* cited by examiner

FIG. 1

$Al_2O_3$ CVD - reaction:
$2Al(CH_3)_3(g) + 3H_2O(g) \rightarrow Al_2O_3(s) + 6CH_4(g)$ ALD $Al_2O_3$ half-reactions: (200°C ~ 1.1 Å/cycle)

"A"  $Al(CH_3)_3(g) + Al\text{-}OH^* \rightarrow Al\text{-}OAl(CH_3)_2^* + CH_4(g)$

"B"  $2H_2O(g) + \text{-}Al(CH_3)_2^* \rightarrow \text{-}Al(OH)_2^* + 2CH_4(g)$

METHOD FOR ELIMINATING RUNOUT OF BRAZE FILLER METAL DURING ACTIVE BRAZING

CROSS-REFERENCE TO RELATED APPLICATION

This application claims the benefit of U.S. Provisional Application No. 62/674,860, filed May 22, 2018, which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to active brazing and, in particular, to a method for eliminating runout of braze filler metal during active brazing by joint preparation with atomic layer deposition of a barrier layer coating.

BACKGROUND OF THE INVENTION

Active brazing is a permanent metallurgical joining method in which highly reactive brazing filler metals are utilized to directly braze metals to nonmetals. The active brazing process involves a complex coupling of chemical surface reaction and interfacial diffusion with surface melting, surface roughness, wetting, spreading, and flow. A typical braze filler metal comprises a surface active element added to a metal alloy to promote wetting and bonding between the metal and nonmetal brazement surfaces. For example, to actively braze a metal object to an alumina object, a Zr-containing Ag-based braze alloy can be put in contact with the alumina faying surface and heated until the alloy melts. The active element Zr will diffuse to the ceramic-braze filler metal interface and react with the alumina to reduce the local oxide, essentially replacing some Al atoms in the alumina with Zr to form the more stable zirconia. Improved wetting is expected because the contact angle of Ag on $ZrO_2$ is smaller than that of Ag on $Al_2O_3$. In addition, atoms from the metal object faying surface can diffuse into the liquid braze alloy and vice versa at the metal-braze filler metal interface. The result is a metal-ceramic joint that is hermetically sealed with high mechanical strength.

Due to limitations of the active brazing filler metal spreading adequately over a ceramic surface, the braze filler metal must be preplaced between the two faying surfaces of the brazement. When heated above the liquidus temperature, the liquid filler metal is normally contained within the brazement by capillary attraction. However, with certain metal-nonmetal base material combinations, chemical reactions at the brazement faying surfaces often lead to excessive braze filler metal flow and runout on the metal surface, potentially rendering the brazed assembly useless.

Figure 1:
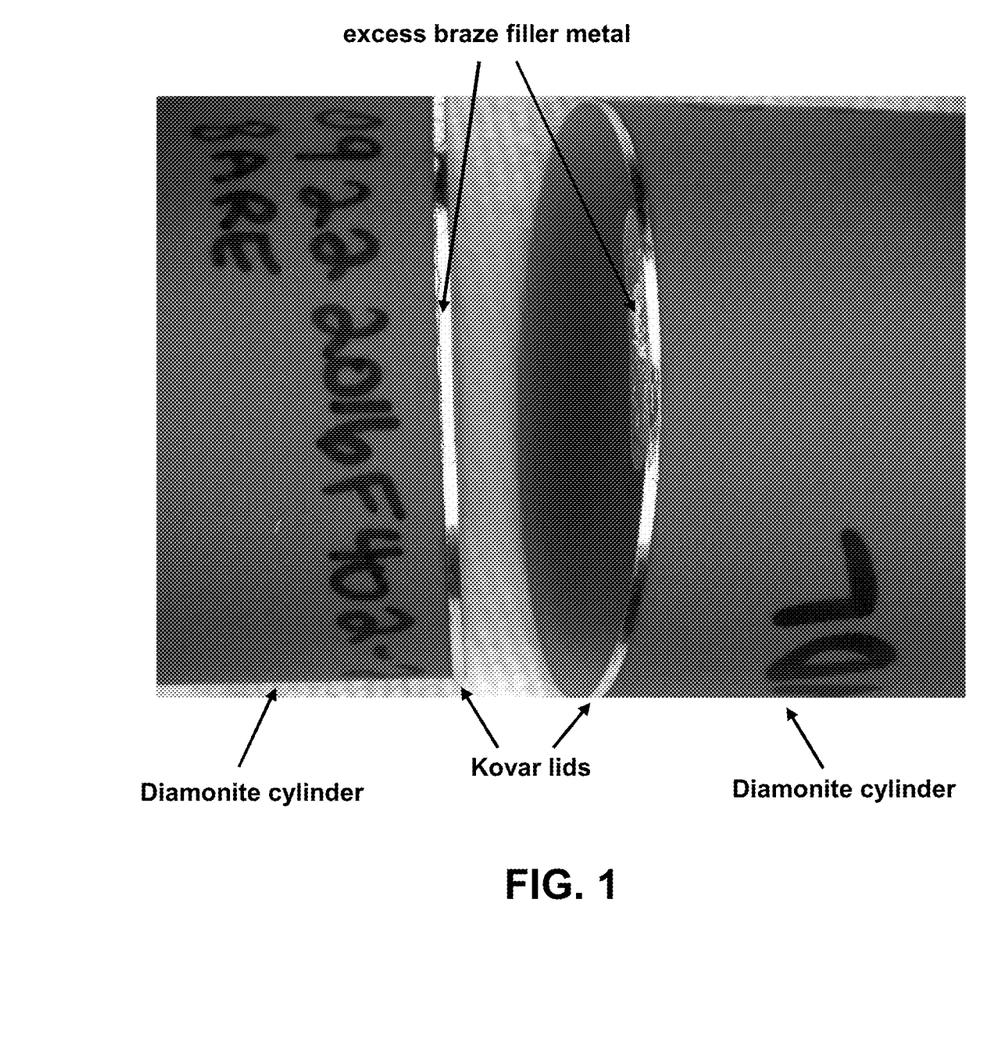
FIG. 1 is a photograph of bare Kovar lids that are actively brazed to Diamonite cylinders.

For example, FIG. 1 is a photograph of bare, flush-mounted Kovar lids that were actively brazed to Diamonite cylinders with a silver-based active braze filler metal (Kovar® is a registered trademark of CRS Holdings, Inc. Kovar is a nickel-cobalt ferrous alloy. Diamonite is a 94% alumina ceramic.). It can be seen in this figure that excess braze filler metal has flowed onto the lid edges and the top surface of the Kovar beyond the joint proper. This runout impedes the ability to make robust, hermetic welds. Atomistic modelling simulations suggest that the $3Zr+2Al_2O_3 \Rightarrow 4Al+3ZrO_2$ redox reaction at the braze filler metal interface and subsequent iron aluminide reactions at the Kovar surface occur within tens of nanoseconds of melting of the braze filler metal, leading to rapid spreading of the liquid filler metal. See M. Chandross, "Simulations of Active Brazing," *Thermec'*, Las Vegas, Nev., December 2013; and P. Vianco et al., "Understanding the Run-out Behavior of a Ag—Cu—Zr Braze Alloy When Used to Join Alumina to an Fe—Ni—Co Alloy," *Proc. 6th International Brazing and Soldering Conference. IBSC* 2015, eds. R. Gourley and C. Walker.

There are commercially produced materials available that can prevent excess braze filler metal flow. These materials, commonly referred to by users as stop-off, braze stop-off or braze-stop, are typically fine oxide ceramic powders in a volatile solvent carrier that are applied to portions of the metal braze assemblies where braze filler metal flow is undesirable. Post-braze powder residues from these stop-off materials are in many cases unacceptable and must be removed, using mechanical or chemical methods and sometimes a combination of both. In instances where post-braze cleaning of stop-off materials cannot be used, other methods to reduce braze filler metal spread/wetting are attempted, such as decreased peak brazing temperature and/or time, reduced braze filler metal volume, joint geometry changes, surface roughness, etc. However, these methods are ineffective for many applications.

SUMMARY OF THE INVENTION

The present invention is directed to a method for eliminating runout of braze filler metal during active brazing, comprising providing a metal object having a faying surface; applying a thin conformal coating of a metal oxide to the metal faying surface; providing a ceramic object having a faying surface; placing a braze filler metal having an active element between the metal-oxide-coated metal faying surface and the ceramic faying surface to form contacted surfaces; and heating the contacted surfaces to above the melt temperature of the braze filler metal to actively braze the faying surfaces and form a brazed joint. Preferably, the thin metal oxide coating is applied by atomic-layer deposition (ALD). Preferably, the thin conformal coating has a thickness greater than 1 nm and preferably less than about 20 nm. For example, the metal object can comprise iron, nickel, cobalt, or alloys thereof. For example, the metal oxide can comprise $Al_2O_3$. The braze filler metal comprises the active element, such as zirconium, titanium, or hafnium, and a metal alloy, such as a silver-based alloy, although other active braze filler metals can also be used. For example, the ceramic object can comprise alumina or aluminum nitride ceramic.

The invention eliminates unwanted excessive flow of the braze filler metal during active brazing by applying a nanometers-thick conformal coating of a metal oxide to the metal surface prior to brazing when joining mixed ceramic/metal interfaces. This thin oxide layer can be completely conformal and balance the surface energies to promote active braze bonding in the joint while preventing flow outside the joint. The thin coating can be applied to the entire metal surface and yet can remain in place after the brazing process is completed and not interfere with subsequent processing steps. In particular, unlike other methods used to prevent excessive braze filler metal flow, the thin coating does not hinder next assembly processes, does not require post-braze cleaning, and does not alter the base material mechanical properties.

BRIEF DESCRIPTION OF THE DRAWINGS

The detailed description will refer to the following drawings, wherein like elements are referred to by like numbers.

DETAILED DESCRIPTION OF THE INVENTION

According to the present invention, a solution to the problem of runout is to mask the metal surface with a thin barrier layer coating. The barrier layer preferably has the properties of conforming to the features of the metal faying surface, limiting surface wetting or spread, not hindering the braze joint performance (i.e., the joint should provide a hermetic seal and have high mechanical strength), remaining intact after brazing, and not compromising subsequent assembly functions.

More particularly, the invention is directed to a method to eliminate runout by applying a very thin conformal coating to the faying surface of the metal object using atomic-layer deposition (ALD). The ALD process inhibits deleterious reactions that occur when the active element (e.g., zirconium, titanium, or hafnium) in the liquid active brazing filler metal reacts with the ceramic and metal faying surfaces. Additionally, unlike other braze-stop materials applied to metal surfaces to prevent excess wetting and spread of the liquid filler metal, this conformal coating adheres completely to the metal surface and is thin enough that it can remain in and not interfere with subsequent joining processes, such as welding, and can be considered particulate free.

ALD is a chemical vapor deposition (CVD) process that uses self-limiting surface reactions applied in a binary sequence, leading to atomic-layer controlled growth of a thin film. ALD is similar to conventional CVD, except that the ALD process breaks the CVD reaction into two half-reactions, keeping the precursor materials separate during the half-reactions. This is accomplished through sequential pulsing of special precursor vapors, each of which forms about one atomic layer on the surface during each reaction cycle, versus CVD that introduces multiple precursor materials simultaneously. Each half-reaction involves the reaction between a gas-phase precursor and a surface function group. The surface reaction continues until all functional groups are consumed and replaced with a new functional group which does not react with that gas-phase precursor. This self-limiting surface chemistry enables conformal coating of surfaces with monolayer precision. Application of the binary sequence ABAB . . . results in layer-by-layer highly conformal film growth.

The ALD thin film can be grown using a chemical reactor. See J. W. Elam et al., *Rev. Sci. Instrum.* 73(8), 2981 (2002), which is incorporated herein by reference. The reactor uses a gas pulse switching method that allows introduction of gaseous and high vapor pressure liquid precursors into the reactor. Precursors can be introduced into the hot-wall reactor using $N_2$ as a carrier gas. Exposure times for the A and B precursors and purge times between A and B pulses can be independently set. Deposition rate can be measured using an in-situ quartz crystal microbalance. Typically, the deposition rate per cycle is constant within a run and very reproducible from run to run.

Figure 2A:
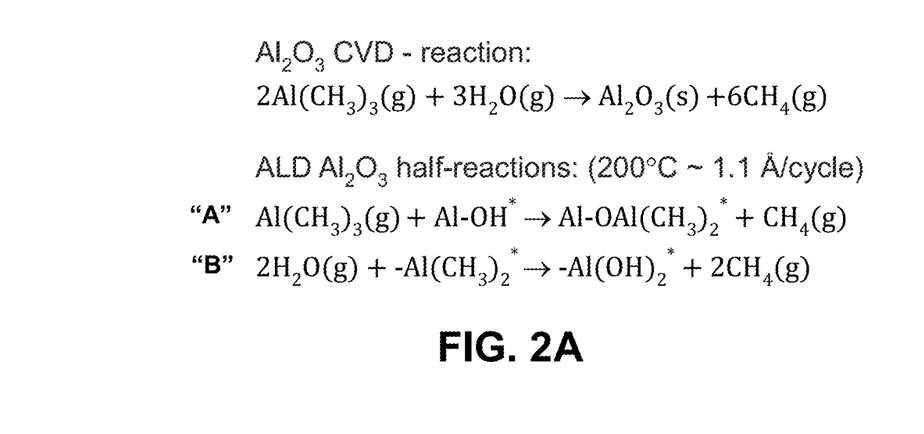
FIG. 2A shows the chemical reaction for depositing $Al_2O_3$ by a conventional chemical vapor deposition (CVD) process and the binary reaction sequence for depositing $Al_2O_3$ by an atomic-layer deposition (ALD) process.
Figure 2B:
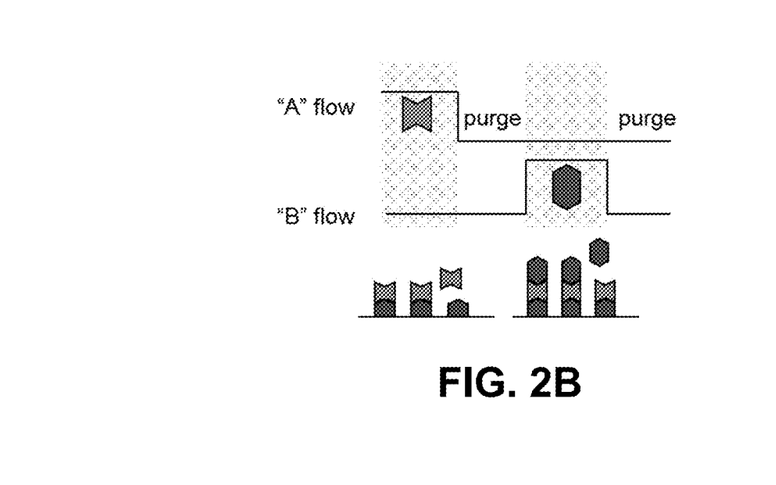
FIG. 2B shows the binary pulse-purge ALD process.
Figure 2C:
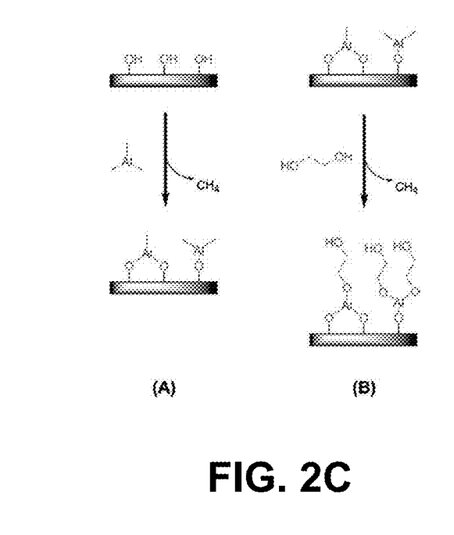
FIG. 2C illustrates the surface reactions of the ALD binary sequence.

A binary reaction sequence for deposition of $Al_2O_3$ using trimethyl aluminum (TMA) and water as precursors is shown in FIG. 2A, where surface species are indicated by asterisks. As shown in FIGS. 2B and 2C, in the "A" flow, TMA is pulsed into the reaction chamber and reacts with surface hydroxyl groups, forming Al—OAl(CH$_3$)$_2$ on the surface and evolving methane. TMA will continue reacting with the surface until all of the surface hydroxyl groups are consumed. The reaction chamber is then purged of the first reactants. Next, water vapor is pulsed into the chamber and reacts with the surface dimethyl aluminum groups, desorbing methane and once again forming a surface hydroxyl group. The chamber is then purged of the second reactants and the sequence is repeated. This reaction cycle is repeated until the desired film thickness is achieved. For the specific process used in the examples below to grow aluminum oxide films on Kovar by ALD, one complete cycle occurred every 32 seconds with a film thickness deposition rate of 1.1 Å (0.11 nm) per cycle.

To evaluate mechanical strength of the braze joint, "tensile button" test samples were prepared according to the ASTM-F19 standard test method. See ASTM International, ASTM F19-11(2016), "Standard Test Method for Tension and Vacuum Testing Metallized Ceramic Seals," West Conshohocken, Pa. This test method establishes the standard procedures for conducting tension and vacuum tests on metal-ceramic seals to determine the bond strength of brazed, metallized ceramics.

Figure 3A:
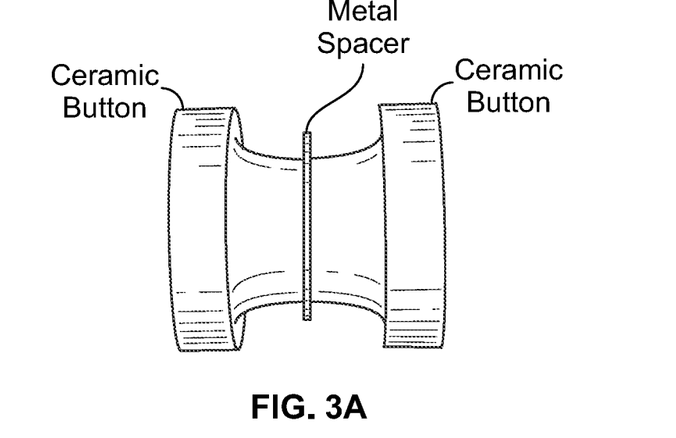
FIG. 3A is a side-view photograph of a "tensile button" test sample comprising an oversized Kovar interlayer sandwiched between two Diamonite ceramic buttons before tensile testing.

FIG. 3A is a photograph of a "tensile button" test sample comprising an oversized Kovar (Fe-29Ni-17Co) metal spacer sandwiched between two Diamonite alumina ceramic buttons by the active braze alloy 97Ag-1Cu-2Zr. The ceramic tensile buttons were cleaned prior to brazing using a 3-step solvent cleaning process followed by resintering at high temperature. The resintering process was accomplished in either wet hydrogen (28° C. dew point) at 1500° C. for 60 minutes, or air-fired at 1575° C. for 120 minutes. The resintering atmosphere appeared to have minimal impact on the excess flow/runout response, hermeticity, or joint strength. The 1.25 mm thick Kovar interlayers and 50 μm thick Ag-1Cu-2Zr braze metal preforms where also cleaned using the 3-step solvent cleaning process. Additionally, the Kovar substrates were subjected to a pickling acid etch process followed by a bright-dip, followed by rinsing in deionized water. The Kovar surfaces were either uncoated ("bare") or ALD coated with 5-20 nm $Al_2O_3$. The samples were brazed in a high-vacuum furnace according to the following temperature cycle:

15° C./min from ambient to 925° C., soak 15 minutes;
10° C./min from 925° C./to 985° C., soak 5 minutes;
25° C./min from 985° C. to 925° C., soak 0 minutes;
Furnace cool (uncontrolled) to ambient.

Figure 3B:
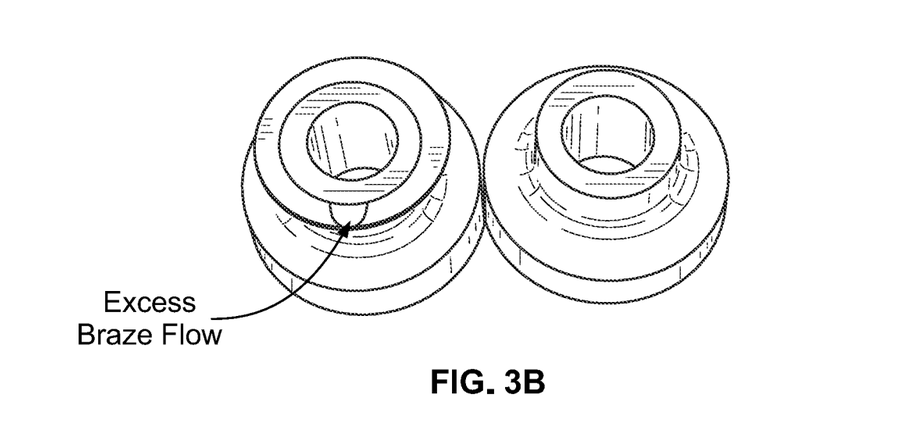
FIG. 3B is a photograph of the fracture surface of a bare Kovar test sample after testing.
Figure 3C:
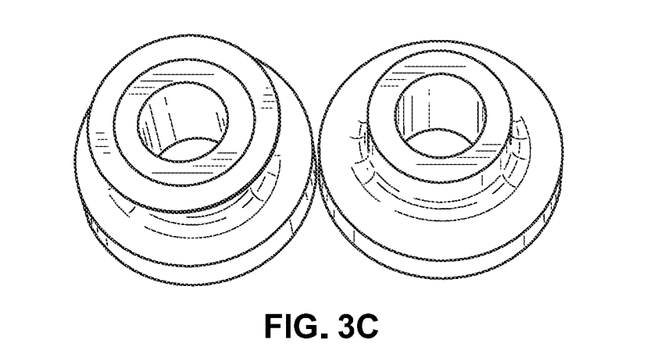
FIG. 3C is a photograph of the fracture surface of an ALD-coated test sample after testing.

This Kovar-silver-based braze metal-alumina combination frequently results in excess flow of the braze filler metal. The oversized Kovar interlayer allows the runout, excessive wetting, and unwanted spread of the braze filler metal to be easily evaluated. FIG. 3B shows the fracture surface of a test sample that did not have an ALD coating on the faying surfaces of the Kovar interlayer after tensile testing. As can be seen in this figure, excess braze flow was observed when sealing with the bare Kovar interlayer only. Conversely, as seen in FIG. 3C, no excess braze flow was observed when the Kovar surface was coated with a 10 nm ALD layer prior to brazing.

Figure 4:
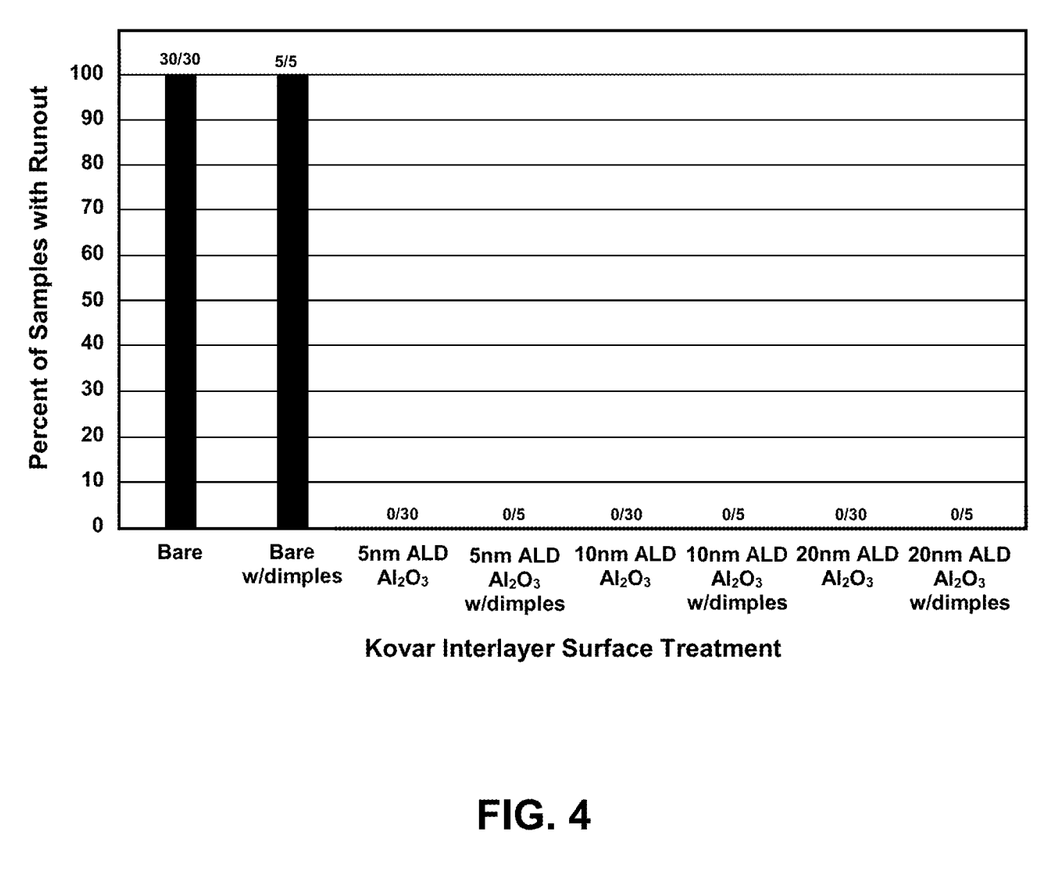
FIG. 4 is a graph of showing the percent of samples showing active braze filler metal runout as a function of Kovar interlayer surface treatment.

FIG. 4 is a graph showing the percent of samples showing runout as a function of Kovar interlayer surface treatment. Some of the Kovar surfaces were dimpled with small mounds or bumps, approximately 25 μm tall, on the faying surface. Dimples can be effective in maintaining braze joint thickness uniformity, which can improve joint tensile strength. All 35 of the samples that were not treated with the ALD $Al_2O_3$ layer ("bare" Kovar) exhibited runout, both with and without dimples. Conversely, all samples in which the Kovar surfaces were ALD coated with 5-20 nm $Al_2O_3$ prior to brazing exhibited no runout, irrespective of the alumina ceramic or resintering atmosphere used. Thus, braze filler metal runout was completely eliminated with a 5 nm ALD alumina coating (some runout was observed with very thin, 1 nm thickness, ALD coatings). A preferred upper end of the thickness range is dependent on post-processing and joint strength requirements. All of the ALD-coated samples exhibited a hermetic seal (<5E-12 atm-cc/sec He leak rate). These results clearly demonstrate the effectiveness of using thin film coatings of ALD alumina to eliminate excessive braze filler metal flow for this system of materials whilst maintaining hermiticity.

Figure 5:
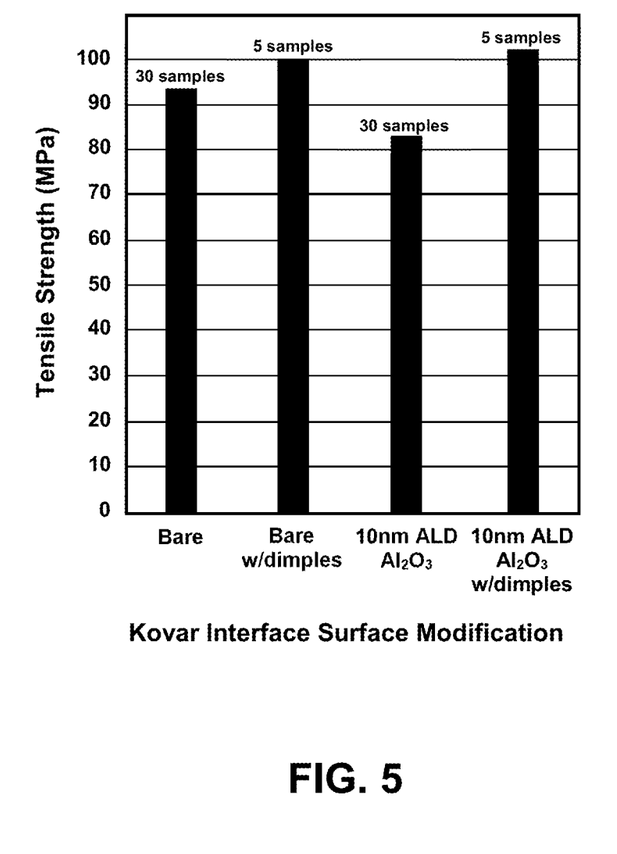
FIG. 5 is a graph of average joint tensile strength for a variety of Kovar interlayer surface modifications tested.

The test buttons were also subjected to tensile testing to determine the strength of the joints with and without the ALD coatings. FIG. 5 is a graph of tensile strength at failure for a variety of Kovar modifications tested. The Diamonite tensile button assemblies incorporating undimpled and uncoated Kovar interlayers had tensile strengths slightly higher, on average, than undimpled 10 nm thick ALD $Al_2O_3$, 94 Mpa (13.5 ksi) versus 83 MPa (12.0 ksi) with standard deviations of 17 MPa and 19 MPa respectively. For the brazed Diamonite tensile buttons incorporating dimples, however, the results were nearly equal for the uncoated interlayers and 10 nm thick ALD $Al_2O_3$ coated interlayers: 100 MPa (14.5 ksi) average tensile strength with a standard deviation of 14 MPa for the uncoated Kovar versus 102 MPa (14.8 ksi) with a standard deviation of 25 MPa for the 10 nm ALD coated samples. Thus, there was minimal loss in joint strength with the ALD $Al_2O_3$ coating as compared to a bare Kovar joint.

Figure 6A:
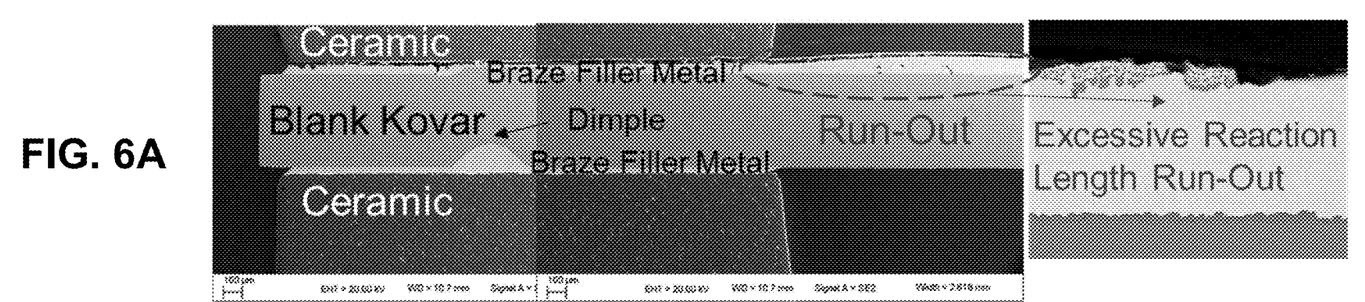
FIG. 6A is a cross-sectional scanning electron microscope (SEM) image of a bare Kovar braze joint.
Figure 6B:
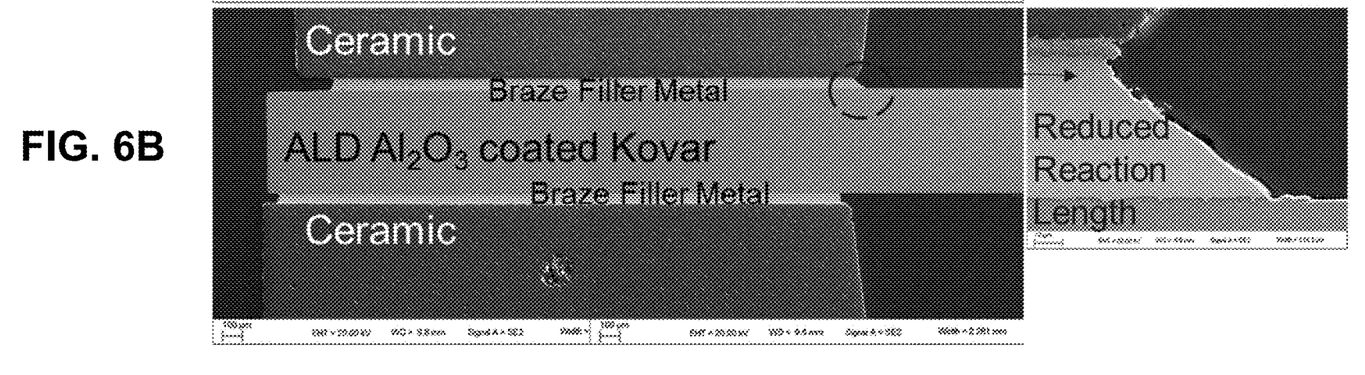
FIG. 6B is a cross-sectional SEM image of a ALD $Al_2O_3$-coated Kovar braze joint.
Figure 7A:
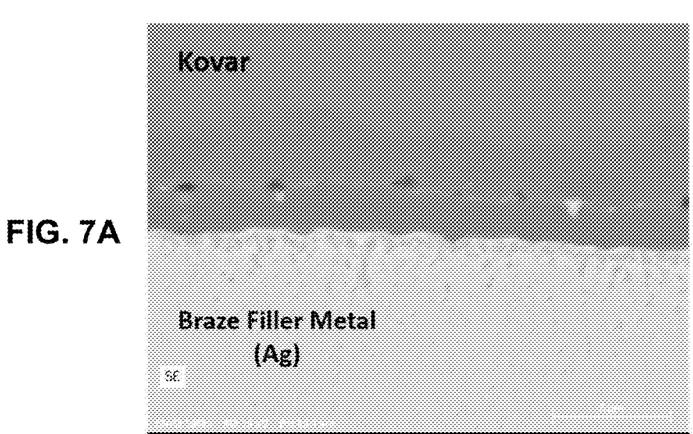
FIG. 7A is an SEM image of the Kovar interface of a Diamonite/97Ag-1Cu-2Zr braze filler metal/10 nm ALD $Al_2O_3$-coated Kovar braze joint.
Figure 7B:
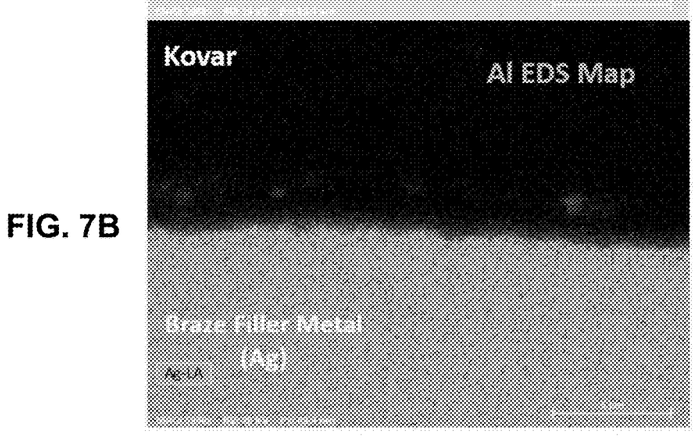
FIG. 7B is a Ag electron dispersive spectroscopy (EDS) map of the interface.
Figure 7C:
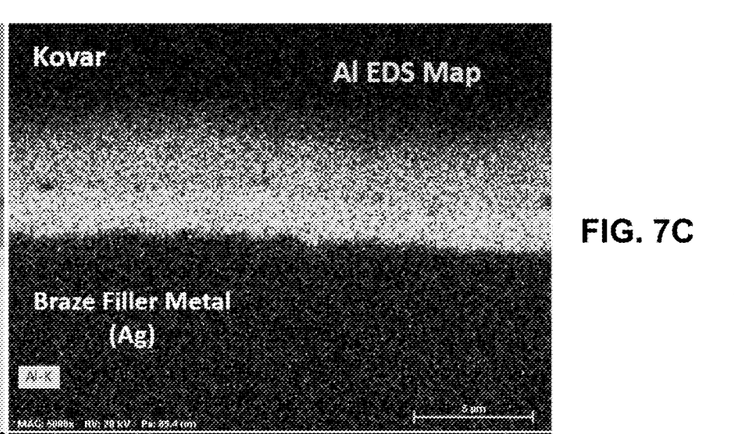
FIG. 7C is an Al EDS map of the interface.
Figure 7D:
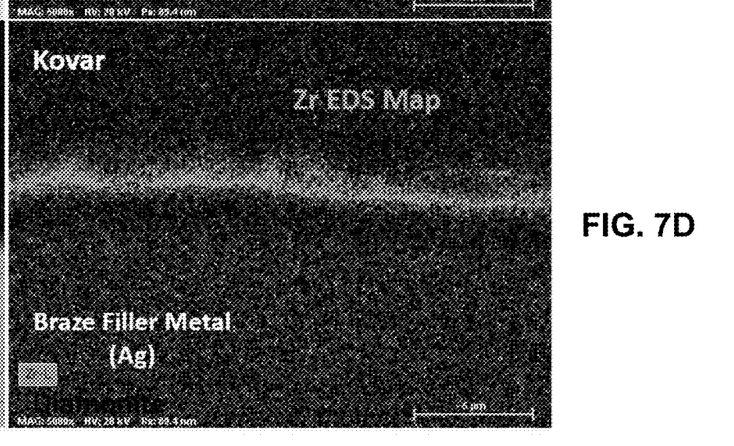
FIG. 7D is a Zr EDS map of the interface.
Figure 8A:
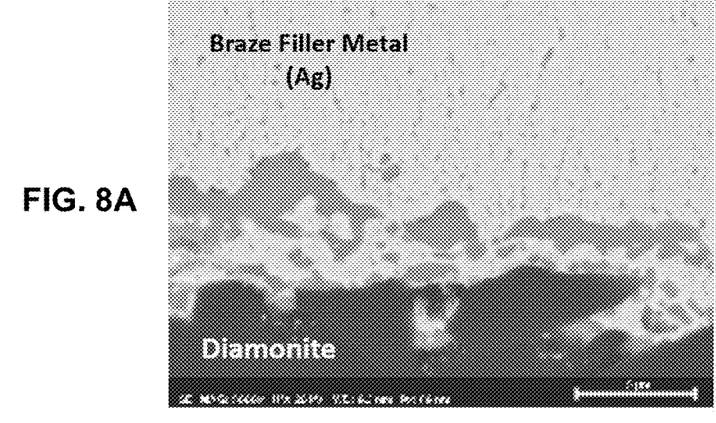
FIG. 8A is an SEM image of the Diamonite interface of a Diamonite/97Ag-1Cu-2Zr braze filler metal/10 nm ALD $Al_2O_3$-coated Kovar braze joint.
Figure 8B:
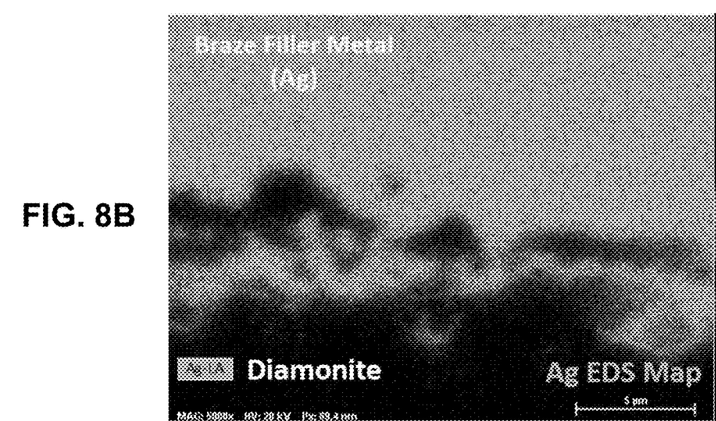
FIG. 8B is a Ag EDS map of the interface.
Figure 8C:
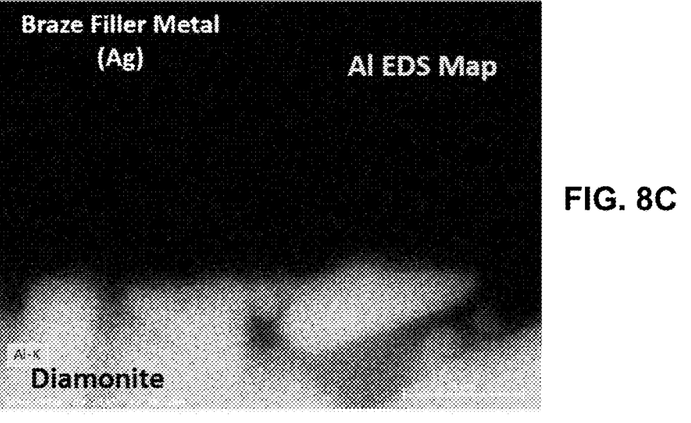
FIG. 8C is an Al EDS map of the interface.
Figure 8D:
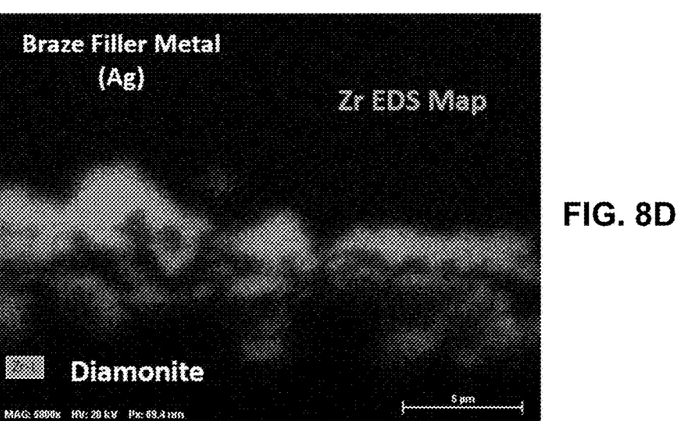
FIG. 8D is a Zr EDS map of the interface.

FIG. 6A shows a cross-sectional scanning electron microscope (SEM) image of a bare Kovar braze joint, showing excessive reaction length and filler metal runout on the unbrazed Kovar surface. FIG. 6B is a cross-sectional SEM image of a ALD $Al_2O_3$-coated Kovar braze joint, showing much reduced reaction length and runout on the $Al_2O_3$-coated Kovar surface. It is apparent from this figure that the coverage of the $Al_2O_3$ coating should be sufficient such that the liquid braze metal does not make direct contact to or wet any bare Kovar metal.

Figure 9A:
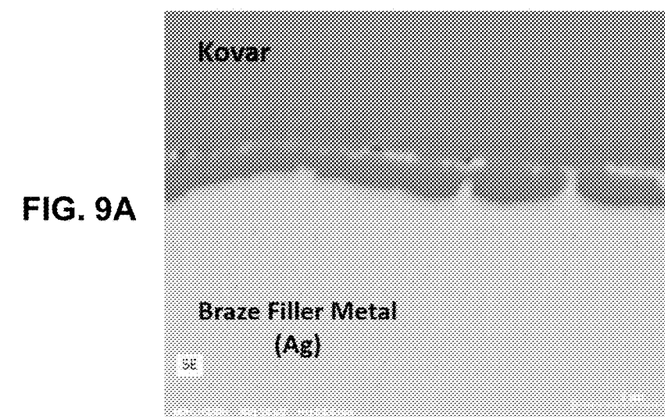
FIG. 9A is an SEM image of the Kovar interface of a Diamonite/97Ag-1Cu-2Zr braze filler metal/bare Kovar braze joint.
Figure 9B:
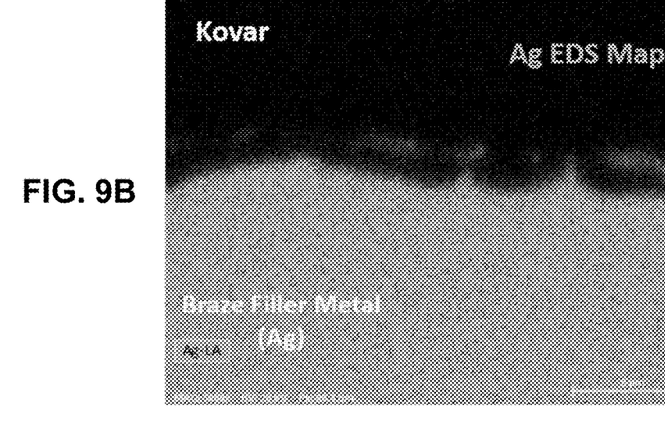
FIG. 9B is a Ag EDS map of the interface.
Figure 9C:
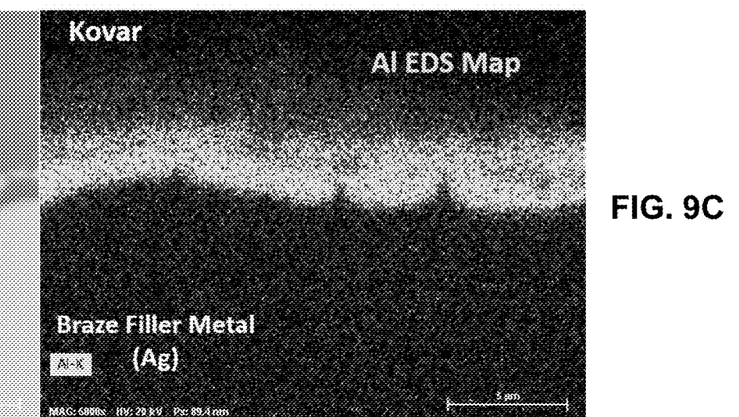
FIG. 9C is an Al EDS map of the interface.
Figure 9D:
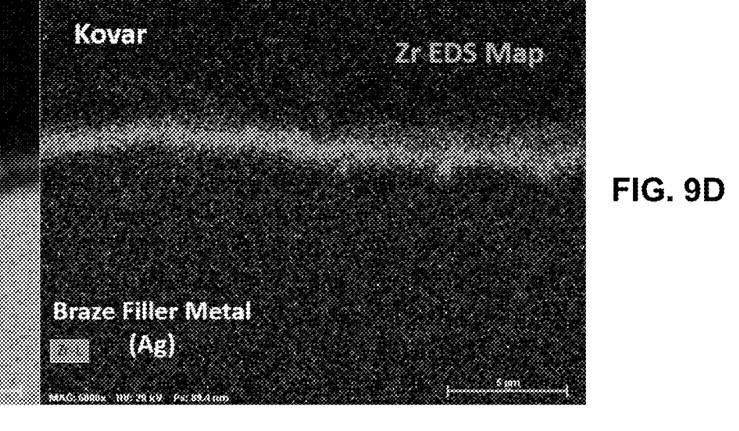
FIG. 9D is a Zr EDS map of the interface.
Figure 10A:
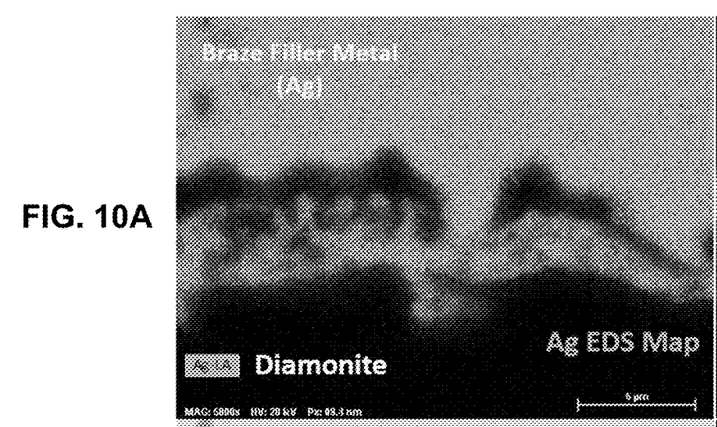
FIG. 10A is an SEM image of the Diamonite interface of a Diamonite/97Ag-1Cu-2Zr braze filler metal/bare Kovar braze joint.
Figure 10B:
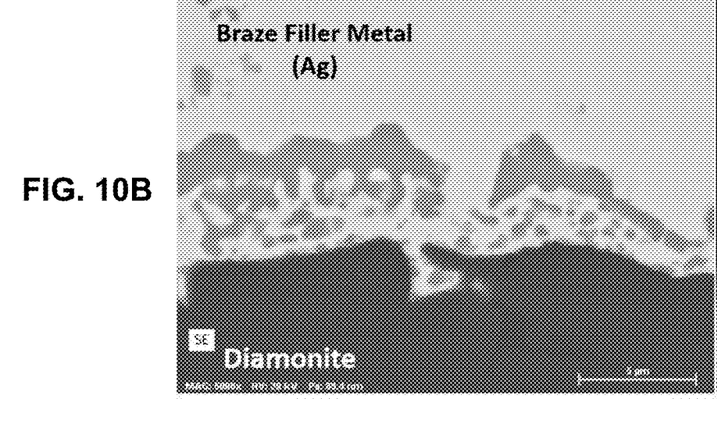
FIG. 10B is a Ag EDS map of the interface.
Figure 10C:
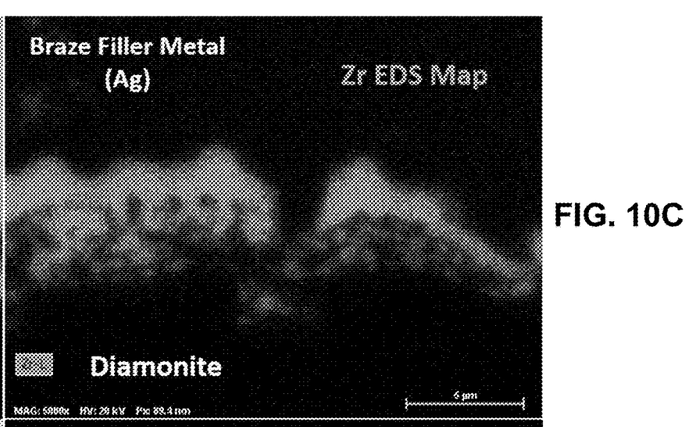
FIG. 10C is an Al EDS map of the interface.
Figure 10D:
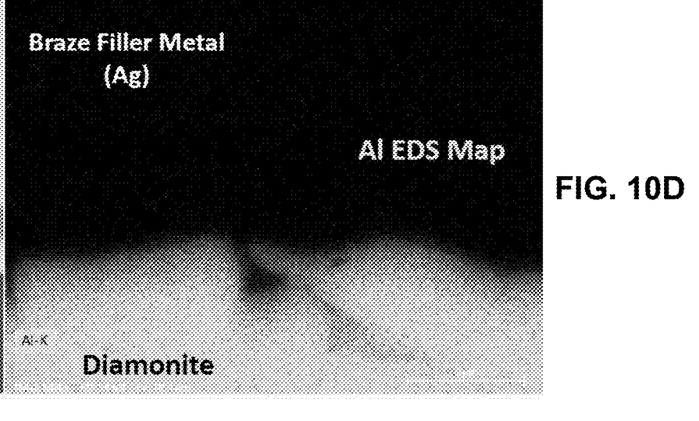
FIG. 10D is a Zr EDS map of the interface.

SEM images and electron dispersive spectroscopy (EDS) maps were obtained to show the reactions at the braze joint interfaces for ALD $Al_2O_3$ coated Kovar and bare Kovar braze joints. FIGS. 7A-D show SEM and EDS maps of a 10 nm ALD $Al_2O_3$-coated Kovar braze joint at the Kovar—braze filler metal interface. FIGS. 8A-D show SEM and EDS maps of the 10 nm ALD $Al_2O_3$-coated Kovar braze joint at the Diamonite—braze filler metal interface. FIGS. 9A-D show SEM and EDS maps of a bare Kovar braze joint at the Kovar—braze filler metal interface. FIGS. 10A-D show SEM and EDS maps of the bare Kovar braze joint at the Diamonite—braze filler metal interface. All of the Zr EDS maps (FIGS. 7D, 8D, 9D, and 10D) show a continuous band of zirconium at both the Kovar and Diamonite interfaces. These continuous layers confirm that there is adequate active element material, Zr, to bond to two individual oxide faying surfaces. Recall the redox reaction mentioned previously, $3Zr+2Al_2O_3 \Rightarrow 4Al+3ZrO_2$. In this reaction, the alumina ceramic, Diamonite, is reduced by the atomic zirconium in the liquid braze filler metal, and the "free" atomic aluminum is brought into the liquid braze filler metal as a result. This highly reactive aluminum in the liquid filler metal is then free to react with exposed surfaces on the Kovar interlayer, forming aluminide compounds (FIG. 9C). These aluminide reactions drive the excessive wetting and spreading behavior on the bare Kovar interlayer surface surrounding the braze joint. In samples having thin ALD $Al_2O_3$ layers deposited on the Kovar interlayers, the same interfacial reactions occur at the two faying surfaces with the zirconium in the liquid braze filler metal. In these samples, however, the alumina is reduced at both interfaces and the atomic aluminum also mixes with the liquid braze filler metal. However, at this point the aluminum is unable to react further as no "bare" Kovar surfaces are exposed, thus no runout occurs.

Alternatively, rather than coating the metal faying surface with $Al_2O_3$, the nonmetal (i.e., alumina) faying surface can be coated with $ZrO_2$, $TiO_2$, or $HfO_2$ to act as a barrier layer to prevent the Zr in the liquid braze filler metal from reacting with the alumina ceramic. $ZrO_2$, $TiO_2$, and $HfO_2$ can be deposited by ALD. By doing this, the metal substrate can remain coating-free, if the designer chooses to do so. This enables the designer to choose the substrate—metal or nonmetal—that is most prudent to receive the ALD coating. Because metallurgical analysis performed to date has not revealed evidence of excessive wetting/flow due to "free" Zr in the molten filler metal (as described above has been observed with "free" Al), the filler metal will remain aluminum free.

The present invention has been described as a method for eliminating runout of braze filler metal during active brazing. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method for eliminating excess runout of braze filler metal during active brazing, comprising:
   providing a metal object having a faying surface;
   applying a thin conformal coating of a metal oxide to the metal faying surface;
   providing a ceramic object having a faying surface;
   placing a braze filler metal having an active element between the metal-oxide-coated metal faying surface and the ceramic faying surface to form contacted surfaces; and
   heating the contacted surfaces to above the melt temperature of the braze filler metal to actively braze the faying surfaces and form a brazed joint,
   wherein the metal oxide coating prevents runout of the braze filler metal beyond the faying surface of the metal object.

2. The method of claim 1, wherein the thin conformal coating is applied by atomic-layer deposition.

3. The method of claim 1, wherein the metal object comprises iron, nickel, cobalt, or alloys thereof.

4. The method of claim 1, wherein the metal oxide comprises $Al_2O_3$.

5. The method of claim 1, wherein the braze filler metal comprises the active element and a metal alloy.

6. The method of claim 5, wherein the active element comprises zirconium, titanium, or hafnium.

7. The method of claim 5, wherein the metal alloy comprises copper and silver.

8. The method of claim 1, wherein the ceramic object comprises alumina or aluminum nitride.

9. The method of claim 1, wherein the thin conformal coating has a thickness of greater than 1 nm.

10. The method of claim 9, wherein the thin conformal coating has thickness less than about 20 nm.

11. A method for eliminating excess runout of braze filler metal during active brazing, comprising:
    providing an alumina object having a faying surface;
    applying a thin conformal coating of a metal oxide to the alumina faying surface;
    providing a metal object having a faying surface;
    placing a braze filler metal having an active element between the metal-oxide-coated alumina faying surface and the metal faying surface to form contacted surfaces; and
    heating the contacted surfaces to above the melt temperature of the braze filler metal to actively braze the faying surfaces and form a brazed joint,
    wherein the metal oxide coating prevents the active element in the braze filler metal from reacting with the alumina object, thereby preventing runout of the braze filler metal beyond the faying surface of the metal object.

12. The method of claim 11, wherein the thin conformal coating is applied by atomic-layer deposition.

13. The method of claim 11, wherein the metal object comprises iron, nickel, cobalt, or alloys thereof.

14. The method of claim 11, wherein the metal oxide comprises $ZrO_2$, $TiO_2$, or $HfO_2$.

15. The method of claim 11, wherein the thin conformal coating has thickness of greater than 1 nm.

* * * * *